US009773652B2

(12) United States Patent
Sano et al.

(10) Patent No.: US 9,773,652 B2
(45) Date of Patent: Sep. 26, 2017

(54) MGO TARGET FOR SPUTTERING

(75) Inventors: Satoru Sano, Ube (JP); Yoshihiro Nishimura, Ube (JP); Takayuki Watanabe, Ube (JP); Yuuzou Katou, Ube (JP); Akira Ueki, Ube (JP); Shinzo Mitomi, Fukuoka (JP); Masanobu Takasu, Fukuoka (JP); Yusuke Hara, Fukuoka (JP); Takaaki Tanaka, Fukuoka (JP)

(73) Assignees: UBE MATERIAL INDUSTRIES, LTD., Yamaguchi (JP); NIPPON TUNGSTEN CO., LTD., Fukuoka (JP)

( * ) Notice: Subject to any disclaimer, the term of this patent is extended or adjusted under 35 U.S.C. 154(b) by 0 days.

(21) Appl. No.: 14/130,438

(22) PCT Filed: Jun. 29, 2012

(86) PCT No.: PCT/JP2012/066789
§ 371 (c)(1),
(2), (4) Date: Jan. 29, 2014

(87) PCT Pub. No.: WO2013/005690
PCT Pub. Date: Jan. 10, 2013

(65) Prior Publication Data
US 2014/0144775 A1 May 29, 2014

(30) Foreign Application Priority Data

Jul. 1, 2011 (JP) .................... 2011-147026
Jan. 24, 2012 (JP) .................... 2012-011746

(51) Int. Cl.
*H01J 37/34* (2006.01)
*C23C 14/34* (2006.01)
*C04B 35/053* (2006.01)
*C04B 35/56* (2006.01)
*C04B 35/58* (2006.01)
*C04B 35/626* (2006.01)
*C04B 35/645* (2006.01)
*G11B 5/851* (2006.01)
*C23C 14/08* (2006.01)

(52) U.S. Cl.
CPC ........ *H01J 37/3429* (2013.01); *C04B 35/053* (2013.01); *C04B 35/5607* (2013.01); *C04B 35/5611* (2013.01); *C04B 35/5626* (2013.01); *C04B 35/58014* (2013.01); *C04B 35/6261* (2013.01); *C04B 35/645* (2013.01); *C23C 14/3407* (2013.01); *C23C 14/3414* (2013.01); *G11B 5/851* (2013.01); *H01J 37/3426* (2013.01); *C04B 2235/3206* (2013.01); *C04B 2235/3839* (2013.01); *C04B 2235/3843* (2013.01); *C04B 2235/3847* (2013.01); *C04B 2235/3886* (2013.01); *C04B 2235/5445* (2013.01); *C04B 2235/761* (2013.01); *C04B 2235/762* (2013.01); *C04B 2235/77* (2013.01); *C23C 14/081* (2013.01); *H01J 37/34* (2013.01)

(58) Field of Classification Search
CPC ............. H01J 37/3426; H01J 37/3429; C04B 35/053; C04B 14/304; C04B 22/066; C04B 28/10; C04B 35/03; C04B 35/05; C04B 41/5029; C04B 2235/3206; C04B 35/5611; C04B 35/5626; C04B 35/58014; C23C 14/3407; C23C 14/3414
USPC ....................... 204/298.12, 298.13
See application file for complete search history.

(56) References Cited

U.S. PATENT DOCUMENTS

| | | | | |
|---|---|---|---|---|
| 4,659,508 A | * | 4/1987 | Higuchi et al. | ............... 252/516 |
| 5,037,102 A | * | 8/1991 | Fukayama | ............. A63B 53/04 |
| | | | | 273/DIG. 23 |
| 2003/0038028 A1 | | 2/2003 | Schultheis et al. | |
| 2005/0115828 A1 | | 6/2005 | Fanton et al. | |
| 2008/0217162 A1 | | 9/2008 | Delrue et al. | |
| 2011/0063771 A1 | * | 3/2011 | Nishioka | ............... C04B 35/053 |
| | | | | 361/234 |

FOREIGN PATENT DOCUMENTS

| | | | | |
|---|---|---|---|---|
| CN | 101229976 A | * | 7/2008 | |
| JP | 63285175 A | * | 11/1988 | |
| JP | 07157837 A | * | 6/1995 | |
| JP | 10167807 A | * | 6/1998 | |
| JP | 10-334444 A | | 12/1998 | |
| JP | 11335824 A | * | 12/1999 | |
| JP | 2001-101645 A | | 4/2001 | |
| JP | 2001-352109 A | | 12/2001 | |
| JP | 2003-073820 A | | 3/2003 | |
| JP | 2005-179129 A | | 7/2005 | |
| JP | 2005-525463 A | | 8/2005 | |
| JP | 2005268203 A | * | 9/2005 | |
| JP | 2009-511742 A | | 3/2009 | |
| JP | 2012-094202 A | | 5/2012 | |
| WO | 03/066928 A1 | | 8/2003 | |
| WO | 2006/129410 A1 | | 12/2006 | |
| WO | 2007/042394 A1 | | 4/2007 | |

OTHER PUBLICATIONS

Borovinskaya, I.P., Vershinnikov, V.I. Self-Propagating High-Temperature Synthesis of Ultrafine and Nanosized WC and TiC Powders, Powder Metallurgy and Metal Ceramic, vol. 47, Nos. 9-10, 2008, p. 505-511 [online] [Accessed on Nov. 12, 2014].*
Machine Translation JP2005268203A.*
Machine Translation JP10167807A.*
International Search Report for PCT/JP2012/066789, Mailing Date of Sep. 18, 2012.

* cited by examiner

*Primary Examiner* — Michael Band
(74) *Attorney, Agent, or Firm* — Westerman, Hattori, Daniels & Adrian, LLP

(57) ABSTRACT

Disclosed is an MgO target for sputtering, which can accelerate a film formation rate even when MgO is used as a target for sputtering in the formation of an MgO film. The MgO target for sputtering, which includes MgO and an electroconductive material as main components, and in which the electroconductive material is capable of imparting orientation to a MgO film when the MgO film containing the electroconductive material is formed by a DC sputtering.

12 Claims, No Drawings

MGO TARGET FOR SPUTTERING

TECHNICAL FIELD

The present invention relates to an MgO target for sputtering, which is capable of forming an MgO film by a DC sputtering method.

BACKGROUND ART

As one of the film formation methods of materials for electronic and electric components, there is being widely used a sputtering method capable of easily controlling film thickness and components, ranging from angstrom units to micron orders. This sputtering method employs an apparatus provided with a positive electrode and a negative electrode, in which a substrate and a target are opposed to each other, and a high voltage is applied to between the substrate and the target under an inert gas atmosphere to generate an electric field. The sputtering method uses the following principle. Namely, ionized electrons and inert gas impinge on each other at that time to form plasma, and positive ions in this plasma impinge on a surface of the target (negative electrode) to eject atoms constituting the target. The ejected atoms are deposited on a surface of the opposing substrate to form a film.

The MgO target for sputtering is suitably used when a ground layer of a device having a layered structure, such as a magnetic recording medium, is manufactured (Patent Literature 1).

CITATION LIST

Patent Literature

Patent Literature 1: JP 2001-101645 A

SUMMARY OF THE INVENTION

Technical Problem

However, in the prior art, when the MgO film is formed, an RF sputtering method is required to be used because MgO is an insulating body, and thus, there are problems that a film formation rate is low and it is inferior in productivity.

Thus, an object of the present invention is to provide an MgO target for sputtering, which can accelerate a film formation rate even when MgO is used as a target for sputtering in the formation of an MgO film.

Solution to Problem

As a result of intensive studies made by the present inventors in order to attain the above object, the present inventors have found that by virtue of the use of a target for sputtering containing MgO and a specific electroconductive material (for example, an electroconductive compound) as main components, an MgO film can be formed by a DC sputtering method and reached the present invention. Namely, the present invention provides an MgO target for sputtering, which comprises MgO and an electroconductive material as main components, and in which the electroconductive material is capable of imparting orientation to a MgO film when the MgO film containing the electroconductive material is formed by a DC sputtering.

Advantageous Effects of Invention

As described above, the present invention can provide a MgO target for sputtering, which can accelerate a film formation rate even when MgO is used as a target material for sputtering in the formation of an MgO film.

DESCRIPTION OF EMBODIMENTS

An MgO target for sputtering according to the present invention is mainly composed of MgO and an electroconductive material, and when the electroconductive material is used along with MgO for the film formation by a DC sputtering method, it is capable of imparting orientation to a formed MgO film. In the present invention, the expression that "capable of imparting the orientation to the formed MgO film" includes formation of an MgO layer having desired orientation such as (001) orientation and (111) orientation.

Although any electroconductive material is applicable as long as it can impart the orientation to a formed MgO film when the electroconductive material is used along with MgO for the film formation by a DC sputtering method, it is particularly preferable to use an electroconductive material which can impart single orientation to a (001) surface of the MgO film when the electroconductive material is used along with MgO for the film formation by the DC sputtering method.

As the electroconductive material capable of imparting the single orientation to the (001) surface of the MgO film, preferred is an electroconductive material of a crystal system such as a cubic crystal system or a hexagonal crystal system, and particularly preferred is at least one electroconductive compound selected from TiC, VC, TiN, and WC. The electroconductive material is not limited to the electroconductive compound and may be a simple substance.

In the MgO target for sputtering according to the present invention, the electroconductive material contained in the MgO target for sputtering is characterized in that the particles of the electroconductive material are in contact with each other in the MgO target to form a path for electrons. The formation of the path for electrons allows the MgO target for sputtering to have electroconductivity, and thus it is preferable. More preferably, the electroconductive material is characterized by existing in a grain boundary of MgO particles. Still more preferably, the electroconductive material is characterized by existing to encompass the MgO particles having a substantially uniform particle diameter.

When the electroconductive material is contained in the MgO target for sputtering in the above constitution, in the film formation by the DC sputtering method, ions impinging on the MgO target for sputtering flow to a negative electrode, and therefore, it is possible to prevent discharge from being stopped by deposition of the ions on the surface of the MgO target for sputtering.

Any form in which the electroconductive material is contained in the MgO target for sputtering may be applied by taking the above constitution. The content of the electroconductive material is not limited to that described below. However, when the above electroconductive compound is used as the electroconductive material, a ratio of MgO to the total of MgO and the electroconductive material is preferably 40 to 90 mol %, more preferably 50 to 90 mol %, particularly preferably 65 to 90 mol %. When the ratio of MgO is more than 90 mol %, a resistance value is large, and DC sputtering may be difficult. When the ratio of MgO is less than 40 mol %, sintering may be difficult, so that it may be difficult to manufacture the MgO target.

The MgO target for sputtering according to the present invention may be obtained, mixing MgO and an electroconductive material, which is capable of imparting the orientation to an MgO film when used along with MgO for the film formation by a DC sputtering method, with the above predetermined ratio, and sintering the obtained mixture by, for example, a well-known method for sintering MgO or the like, such as pressureless sintering, hot press sintering, hot isostatic press (HIP) sintering, and spark plasma sintering (SPS). The sintering temperature is suitably regulated depending on the ratio of MgO contained in a raw material and is preferably 1800 to 1950 K, more preferably 1890 to 1950 K. If the sintering temperature is too high, the electroconductivity of the target may be deteriorated. If the sintering temperature is too low, sintering may not be performed, and a uniform film may not be obtained so that gas is included after film formation; therefore, it is not preferable. In this way, conditions of material, composition, mixing, and sintering are suitably combined as descried above, whereby electroconductive material particles are arranged in the grain boundary of the MgO particles, and when the additive amount of the electroconductive material particles increases, a target for DC sputtering having a contacting/coupling sectional structure can be manufactured. For example, when the sintering temperature is too high, the MgO particles are grown, so that the electroconductive material particles penetrate into the MgO particles. In this case, since the electroconductive material particles are not arranged in the grain boundary of the MgO particles, there may be a problem that the electroconductivity is deteriorated.

When the MgO target for sputtering according to the present invention is manufactured as above, the electroconductive material particles in a sintered body therein are connected to each other, and the MgO target becomes electroconductive; therefore, the MgO film can be formed by the DC sputtering method. Namely, in the manufacturing the MgO target for sputtering as described above, when the electroconductive material particles are arranged in the grain boundary of the MgO particles, a so-called electron tunneling effect allows the MgO target to have the electroconductivity even if the electroconductive material particles cannot be in contact with each other. Further, when there is provided a structure in which the electroconductive material particles are in contact with each other or coupled to each other to such an extent that the electroconductive material particles can be in contact with each other, a target material for DC sputtering having better electroconductivity can be made, and the MgO film can be formed by the DC sputtering method. When the electroconductive material is used along with the MgO film for the film formation by the DC sputtering, the MgO film having the orientation can be formed; therefore, the MgO film is good in matching with other layers and can be suitably used as a ground layer of a device having a layer structure.

The electrical resistivity of the MgO target for sputtering according to the present invention is preferably $1 \times 10^{-4}$ to $1 \times 10^9$ mΩ·cm. When the electrical resistivity is too high, sputtering may not be performed. When the electrical resistivity is too low, particles may be produced in a film, and in addition, since the sputtering ratio is different between MgO and the electroconductive material, the sputtering rate of the electroconductive material becomes slow to cause formation of an inhomogeneous film, and therefore it is not preferable. When the electrical resistivity is in the above range, a preferable film formation rate is obtained, and the MgO film can be produced at high efficiency by the DC sputtering method.

When the electroconductive material of the MgO target for sputtering according to the present invention is used along with MgO for the film formation by the DC sputtering method, an MgO film having single orientation can be formed on a (001) surface. Thus, such a film can be suitably used as a ground layer for a magnetic layer of a magnetic recording medium. In the prior art, since the magnetic recording medium has a layered structure including many layers, the DC sputtering method and an RF sputtering method are required to be separately used depending on the layers. However, when the MgO target for sputtering according to the present invention is used, each layer can be produced using the DC sputtering method. Thus, the speed of manufacturing the magnetic recording medium can be accelerated.

EXAMPLES

Hereinafter, the present invention will be specifically described based on examples. These examples do not limit the object of the invention. First, a method of analyzing a formed film will be shown as follows.
(Scanning Electron Microscope (SEM))
A cut surface of a film-formed substrate was observed by SEM, and it was confirmed that a film having a thickness of about 200 nm was formed on the substrate.
(X-Ray Diffraction (XRD) Measurement)
XRD measurement was performed using an ATX-G type multifunctional X-ray diffraction apparatus for surface structure evaluation manufactured by Rigaku Corporation. The crystallinity of a film was confirmed by In-plane measurement in which measurement is performed by applying an X ray to the vicinity of a sample surface at an angle not more than a total reflection critical angle. The In-plane measurement was performed under conditions that the X-ray incident angle was 0.10 degree, the measurement interval (2θ) was 0.02 degree, and the measuring speed was 5 degree/min.
(Transmission Electron Microscope (TEM) Observation)
Samples of substrates produced using the respective targets were processed thin, and TEM and an electron diffraction image were observed. From this result, it was confirmed that a film was grown on the substrate in an oriented.
(Method of Manufacturing Target for Sputtering)

Example 1

90.0 mol % of an MgO powder having an average particle diameter of 0.2 μm and a purity of 5 N and 10.0 mol % of a TiC powder having an average particle diameter of 1.0 μm and a purity of 3 N were blended. Thereafter, the blended powder were dispersed and mixed for 24 hours in a methanol solvent in a nylon pot in which a nylon ball is put, and an MgO—TiC slurry was obtained. The obtained MgO—TiC slurry was taken from the nylon pot and dried, followed by classifying with a #50 mesh sieve.

An obtained granulated powder was molded by a mold press, whereby a molded body of the MgO target for sputtering was obtained. The molded body was hot press sintered for 90 minutes while a pressure of 25 MPa was applied at the time of sintering by a hot press apparatus in an Ar gas atmosphere at a temperature of 1898 K, whereby a dense sintered body having a relative density of not less than 99% (MgO target for sputtering according to the Example 1) was obtained. The electrical resistivity of the manufactured MgO target for sputtering according to the Example 1 was $1 \times 10^6$ mΩ·cm.

Example 2

An MgO target for sputtering according to the Example 2 (electrical resistivity: $1 \times 10^6$ mΩ·cm) was manufactured as in the Example 1, except that the amount of the MgO powder was changed to 89.0 mol %, and the amount of the TiC powder was changed to 11.0 mol %.

Example 3

An MgO target for sputtering according to the Example 3 (electrical resistivity: $5 \times 10^5$ mΩ·cm) was manufactured as in the Example 1, except that the amount of the MgO powder was changed to 88.0 mol %, and the amount of the TiC powder was changed to 12.0 mol %.

Example 4

An MgO target for sputtering according to the Example 4 (electrical resistivity: 47.39 mΩ·cm) was manufactured as in the Example 1, except that the amount of the MgO powder was changed to 85.6 mol %, and the amount of the TiC powder was changed to 14.4 mol %.

Example 5

An MgO target for sputtering according to the Example 5 (electrical resistivity: 2.04 mΩ·cm) was manufactured as in the Example 1, except that the amount of the MgO powder was changed to 77.6 mol %, and the amount of the TiC powder was changed to 22.4 mol %. When the lattice constant of a film formed by a film formation method to be described later was calculated by an electron diffraction image obtained by TEM, it was 4.2 Å.

Example 6

An MgO target for sputtering according to the Example 6 (electrical resistivity: 0.08 mΩ·cm) was manufactured as in the Example 1, except that the amount of the MgO powder was changed to 60.0 mol %, the amount of the TiC powder was changed to 40.0 mol %, and the sintering temperature was changed to 1923 K.

Example 7

An MgO target for sputtering according to the Example 7 (electrical resistivity: 0.03 mΩ·cm) was manufactured as in the Example 1, except that the amount of the MgO powder was changed to 55.0 mol %, the amount of the TiC powder was changed to 45.0 mol %, and the sintering temperature was changed to 1948 K.

Example 8

An MgO target for sputtering according to the Example 8 (electrical resistivity: 0.01 mΩ·cm) was manufactured as in the Example 1, except that the amount of the MgO powder was changed to 50.0 mol %, the amount of the TiC powder was changed to 50.0 mol %, and the sintering temperature was changed to 1948 K.

Example 9

An MgO target for sputtering according to the Example 9 (electrical resistivity: $3.4 \times 10^5$ mΩ·cm) was manufactured as in the Example 1, except that the amount of the MgO powder was changed to 90.0 mol %, and the TiC powder was changed to 10 mol % of a VC powder having an average particle diameter of 1.0 μm and a purity of 2 N.

Example 10

An MgO target for sputtering according to the Example 10 (electrical resistivity: $2.3 \times 10^5$ mΩ·cm) was manufactured as in the Example 1, except that the amount of the MgO powder was changed to 89.0 mol %, and the TiC powder was changed to 11 mol % of the VC powder having an average particle diameter of 1.0 μm and a purity of 2 N.

Example 11

An MgO target for sputtering according to the Example 11 (electrical resistivity: $1.1 \times 10^5$ mΩ·cm) was manufactured as in the Example 1, except that the amount of the MgO powder was changed to 88.0 mol %, and the TiC powder was changed to 12.0 mol % of the VC powder having an average particle diameter of 1.0 μm and a purity of 2 N.

Example 12

An MgO target for sputtering according to the Example 12 (electrical resistivity: 11.85 mΩ·cm) was manufactured as in the Example 1, except that the amount of the MgO powder was changed to 85.0 mol %, and the TiC powder was changed to 15.0 mol % of the VC powder having an average particle diameter of 1.0 μm and a purity of 2 N.

Example 13

An MgO target for sputtering according to the Example 13 (electrical resistivity: 0.65 mΩ·cm) was manufactured as in the Example 1, except that the amount of the MgO powder was changed to 69.3 mol %, the TiC powder was changed to 30.7 mol % of the VC powder having an average particle diameter of 1.0 μm and a purity of 2 N, and the sintering temperature was changed to 1923 K.

Example 14

An MgO target for sputtering according to the Example 14 (electrical resistivity: 0.02 mΩ·cm) was manufactured as in the Example 1, except that the amount of the MgO powder was changed to 60.0 mol %, the TiC powder was changed to 40 mol % of the VC powder having an average particle diameter of 1.0 μm and a purity of 2 N, and the sintering temperature was changed to 1923 K.

Example 15

An MgO target for sputtering according to the Example 15 (electrical resistivity: 0.008 mΩ·cm) was manufactured as in the Example 1, except that the amount of the MgO powder was changed to 55.0 mol %, the TiC powder was changed to 45 mol % of the VC powder having an average particle diameter of 1.0 μm and a purity of 2 N, and the sintering temperature was changed to 1948 K.

Example 16

An MgO target for sputtering according to the Example 16 (electrical resistivity: 0.002 mΩ·cm) was manufactured as in the Example 1, except that the amount of the MgO powder was changed to 50.0 mol %, the TiC powder was changed to 50.0 mol % of the VC powder having an average particle diameter of 1.0 μm and a purity of 2 N, and the sintering temperature was changed to 1948 K.

Example 17

An MgO target for sputtering according to the Example 17 (electrical resistivity: $2.9 \times 10^5$ mΩ·cm) was manufactured as in the Example 1, except that the amount of the MgO powder was changed to 90.0 mol %, and the TiC powder was changed to 10 mol % of a WC powder having an average particle diameter of 1.0 μm and a purity of 2 N.

Example 18

An MgO target for sputtering according to the Example 18 (electrical resistivity: $2.1 \times 10^5$ mΩ·cm) was manufactured as in the Example 1, except that the amount of the MgO powder was changed to 89.0 mol %, and the TiC powder was changed to 11 mol % of the WC powder having an average particle diameter of 1.0 μm and a purity of 2 N.

Example 19

An MgO target for sputtering according to the Example 19 (electrical resistivity: $1.1 \times 10^5$ mΩ·cm) was manufactured as in the Example 1, except that the amount of the MgO powder was changed to 88.0 mol %, and the TiC powder was changed to 12.0 mol % of the WC powder having an average particle diameter of 1.0 μm and a purity of 2 N.

Example 20

An MgO target for sputtering according to the Example 20 (electrical resistivity: 10.2 mΩ·cm) was manufactured as in the Example 1, except that the amount of the MgO powder was changed to 85.0 mol %, and the TiC powder was changed to 15.0 mol % of the WC powder having an average particle diameter of 1.0 μm and a purity of 2 N.

Example 21

An MgO target for sputtering according to the Example 21 (electrical resistivity: 0.58 mΩ·cm) was manufactured as in the Example 1, except that the amount of the MgO powder was changed to 72.1 mol %, the TiC powder was changed to 27.9 mol % of the WC powder having an average particle diameter of 1.0 μm and a purity of 2 N, and the sintering temperature was changed to 1923 K.

Example 22

An MgO target for sputtering according to the Example 22 (electrical resistivity: 0.01 mΩ·cm) was manufactured as in the Example 1, except that the amount of the MgO powder was changed to 60.0 mol %, the TiC powder was changed to 40.0 mol % of the WC powder having an average particle diameter of 1.0 μm and a purity of 2 N, and the sintering temperature was changed to 1923 K.

Example 23

An MgO target for sputtering according to the Example 23 (electrical resistivity: 0.005 mΩ·cm) was manufactured as in the Example 1, except that the amount of the MgO powder was changed to 55.0 mol %, the TiC powder was changed to 45.0 mol % of the WC powder having an average particle diameter of 1.0 μm and a purity of 2 N, and the sintering temperature was changed to 1948 K.

Example 24

An MgO target for sputtering according to the Example 24 (electrical resistivity: 0.001 mΩ·cm) was manufactured as in the Example 1, except that the amount of the MgO powder was changed to 50.0 mol %, the TiC powder was changed to 50.0 mol % of the WC powder having an average particle diameter of 1.0 μm and a purity of 2 N, and the sintering temperature was changed to 1948 K.

Example 25

An MgO target for sputtering according to the Example 25 (electrical resistivity: $1 \times 10^6$ mΩ·cm) was manufactured as in the Example 1, except that the amount of the MgO powder was changed to 90.0 mol %, and the TiC powder was changed to 10.0 mol % of a TiN powder having an average particle diameter of 1.0 μm and a purity of 2 N.

Example 26

An MgO target for sputtering according to the Example 26 (electrical resistivity: $1 \times 10^6$ mΩ·cm) was manufactured as in the Example 1, except that the amount of the MgO powder was changed to 89.0 mol %, and the TiC powder was changed to 11.0 mol % of the TiN powder having an average particle diameter of 1.0 μm and a purity of 2 N.

Example 27

An MgO target for sputtering according to the Example 27 (electrical resistivity: $1 \times 10^6$ mΩ·cm) was manufactured as in the Example 1, except that the amount of the MgO powder was changed to 88.0 mol %, and the TiC powder was changed to 12.0 mol % of the TiN powder having an average particle diameter of 1.0 μm and a purity of 2 N.

Example 28

An MgO target for sputtering according to the Example 28 (electrical resistivity: 80 mΩ·cm) was manufactured as in the Example 1, except that the amount of the MgO powder was changed to 85.0 mol %, and the TiC powder was changed to 15.0 mol % of the TiN powder having an average particle diameter of 1.0 μm and a purity of 2 N.

Example 29

An MgO target for sputtering according to the Example 29 (electrical resistivity: 4 mΩ·cm) was manufactured as in the Example 1, except that the amount of the MgO powder was changed to 75.2 mol %, and the TiC powder was changed to 24.8 mol % of the TiN powder having an average particle diameter of 1.0 μm and a purity of 2 N

Example 30

An MgO target for sputtering according to the Example 30 (electrical resistivity: 0.01 mΩ·cm) was manufactured as in the Example 1, except that the amount of the MgO powder was changed to 60.0 mol %, the TiC powder was changed to 40.0 mol % of the TiN powder having an average particle diameter of 1.0 μm and a purity of 2 N, and the sintering temperature was changed to 1923 K.

Example 31

An MgO target for sputtering according to the Example 31 (electrical resistivity: 0.005 mΩ·cm) was manufactured as in the Example 1, except that the amount of the MgO powder was changed to 55 mol %, the TiC powder was changed to 45 mol % of the TiN powder having an average particle diameter of 1.0 μm and a purity of 2 N, and the sintering temperature was changed to 1948 K.

Example 32

An MgO target for sputtering according to the Example 32 (electrical resistivity: 0.001 mΩ·cm) was manufactured as in the Example 1, except that the amount of the MgO powder was changed to 50.0 mol %, the TiC powder was changed to 50.0 mol % of the TiN powder having an average particle diameter of 1.0 μm and a purity of 2 N, and the sintering temperature was changed to 1948 K.

Comparative Example 1

An MgO target for sputtering according to the Comparative Example 1 (electrical resistivity: not less than $1 \times 10^{15}$ mΩ·cm) was manufactured as in the Example 1, except that the amount of the MgO powder was changed to 100.0 mol %, the amount of the TiC powder was changed to 0 mol %, and the sintering temperature was changed to 1873 K.

Comparative Example 2

An MgO target for sputtering according to the comparative Example 2 (electrical resistivity: $1 \times 10^{13}$ mΩ·cm) was manufactured as in the Example 1, except that the amount of the MgO powder was changed to 95.0 mol %, the amount of the TiC powder was changed to 5.0 mol %, and the sintering temperature was changed to 1873 K.

Comparative Example 3

An MgO target for sputtering according to the comparative Example 3 (electrical resistivity: $1 \times 10^{10}$ mΩ·cm) was manufactured as in the Example 1, except that the amount of the MgO powder was changed to 92.9 mol %, the amount of the TiC powder was changed to 7.1 mol %, and the sintering temperature was changed to 1873 K.

Comparative Example 4

An MgO target for sputtering according to the comparative Example 4 (electrical resistivity: $1.6 \times 10^{8}$ mΩ·cm) was manufactured as in the Example 1, except that the amount of the MgO powder was changed to 91.0 mol %, the amount of the TiC powder was changed to 9.0 mol %, and the sintering temperature was changed to 1873 K.

Example 33

An MgO target for sputtering according to the Example 33 (electrical resistivity: $1.6 \times 10^{-3}$ mΩ·cm) was manufactured as in the Example 1, except that the amount of the MgO powder was changed to 49.0 mol %, the amount of the TiC powder was changed to 51.0 mol %, and the sintering temperature was changed to 1948 K.

Example 34

An MgO target for sputtering according to the Example 34 (electrical resistivity: $4 \times 10^{-4}$ mΩ·cm) was manufactured as in the Example 1, except that the amount of the MgO powder was changed to 45.0 mol %, the amount of the TiC powder was changed to 55.0 mol %, and the sintering temperature was changed to 1948 K.

Example 35

An MgO target for sputtering according to the Example 35 (electrical resistivity: $5 \times 10^{-5}$ mΩ·cm) was manufactured as in the Example 1, except that the amount of the MgO powder was changed to 40.0 mol %, the amount of the TiC powder was changed to 60.0 mol %, and the sintering temperature was changed to 1948 K.

Comparative Example 5

An MgO target for sputtering according to the comparative Example 5 (electrical resistivity: $1 \times 10^{13}$ mΩ·cm) was manufactured as in the Example 1, except that the amount of the MgO powder was changed to 95 mol %, the TiC powder was changed to 5 mol % of the VC powder having an average particle diameter of 1.0 μm and a purity of 2 N, and the sintering temperature was changed to 1898 K.

Comparative Example 6

An MgO target for sputtering according to the comparative Example 6 (electrical resistivity: $1 \times 10^{8}$ mΩ·cm) was manufactured as in the Example 1, except that the amount of the MgO powder was changed to 91.0 mol %, the TiC powder was changed to 9.0 mol % of the VC powder having an average particle diameter of 1.0 μm and a purity of 2 N, and the sintering temperature was changed to 1873 K.

Example 36

An MgO target for sputtering according to the Example 36 (electrical resistivity: $1.0 \times 10^{-3}$ mΩ·cm) was manufactured as in the Example 1, except that the amount of the MgO powder was changed to 49.0 mol %, the TiC powder was changed to 51.0 mol % of the VC powder having an average particle diameter of 1.0 μm and a purity of 2 N, and the sintering temperature was changed to 1948 K.

Example 37

An MgO target for sputtering according to the Example 37 (electrical resistivity: $1 \times 10^{-4}$ mΩ·cm) was manufactured as in the Example 1, except that the amount of the MgO powder was changed to 45.0 mol %, the TiC powder was changed to 55.0 mol % of the VC powder having an average particle diameter of 1.0 μm and a purity of 2 N, and the sintering temperature was changed to 1948 K.

Example 38

An MgO target for sputtering according to the Example 38 (electrical resistivity: $1 \times 10^{-5}$ mΩ·cm) was manufactured as in the Example 1, except that the amount of the MgO powder was changed to 40.0 mol %, the TiC powder was changed to 60.0 mol % of the VC powder having an average particle diameter of 1.0 μm and a purity of 2 N, and the sintering temperature was changed to 1948 K.

Comparative Example 7

An MgO target for sputtering according to the comparative Example 7 (electrical resistivity: $1 \times 10^{13}$ mΩ·cm) was manufactured as in the Example 1, except that the amount of the MgO powder was changed to 95.0 mol %, the TiC powder was changed to 5 mol % of the WC powder having an average particle diameter of 1.0 μm and a purity of 2 N, and the sintering temperature was changed to 1873 K.

Comparative Example 8

An MgO target for sputtering according to the comparative Example 8 (electrical resistivity: 1×10$^8$ mΩ·cm) was manufactured as in the Example 1, except that the amount of the MgO powder was changed to 91.0 mol %, the TiC powder was changed to 9.0 mol % of the WC powder having an average particle diameter of 1.0 μm and a purity of 2 N, and the sintering temperature was changed to 1873 K.

Example 39

An MgO target for sputtering according to the Example 39 (electrical resistivity: 1.0×10$^{-3}$ mΩ·cm) was manufactured as in the Example 1, except that the amount of the MgO powder was changed to 49.0 mol %, the TiC powder was changed to 51.0 mol % of the WC powder having an average particle diameter of 1.0 μm and a purity of 2 N, and the sintering temperature was changed to 1948 K.

Example 40

An MgO target for sputtering according to the Example 40 (electrical resistivity: 1×10$^{-4}$ mΩ·cm) was manufactured as in the Example 1, except that the amount of the MgO powder was changed to 45.0 mol %, the TiC powder was changed to 55.0 mol % of the WC powder having an average particle diameter of 1.0 μm and a purity of 2 N, and the sintering temperature was changed to 1948 K.

Example 41

An MgO target for sputtering according to the Example 41 (electrical resistivity: 1×10$^{-5}$ mΩ·cm) was manufactured as in the Example 1, except that the amount of the MgO powder was changed to 40.0 mol %, the TiC powder was changed to 60.0 mol % of the WC powder having an average particle diameter of 1.0 μm and a purity of 2 N, and the sintering temperature was changed to 1948 K.

Comparative Example 9

An MgO target for sputtering according to the comparative Example 9 (electrical resistivity: 8×10$^{13}$ mΩ·cm) was manufactured as in the Example 1, except that the amount of the MgO powder was changed to 95.0 mol %, the TiC powder was changed to 5.0 mol % of the TiN powder having an average particle diameter of 1.0 μm and a purity of 2 N, and the sintering temperature was changed to 1873 K.

Comparative Example 10

An MgO target for sputtering according to the comparative Example 10 (electrical resistivity: 8×10$^8$ mΩ·cm) was manufactured as in the Example 1, except that the amount of the MgO powder was changed to 91.0 mol %, the TiC powder was changed to 9.0 mol % of the TiN powder having an average particle diameter of 1.0 μm and a purity of 2 N, and the sintering temperature was changed to 1873 K.

Example 42

An MgO target for sputtering according to the Example 42 (electrical resistivity: 7.0×10$^{-3}$ mΩ·cm) was manufactured as in the Example 1, except that the amount of the MgO powder was changed to 49.0 mol %, the TiC powder was changed to 51.0 mol % of the TiN powder having an average particle diameter of 1.0 μm and a purity of 2 N, and the sintering temperature was changed to 1948 K.

Example 43

An MgO target for sputtering according to the Example 43 (electrical resistivity: 8×10$^{-4}$ mΩ·cm) was manufactured as in the Example 1, except that the amount of the MgO powder was changed to 45.0 mol %, the TiC powder was changed to 55.0 mol % of the TiN powder having an average particle diameter of 1.0 μm and a purity of 2 N, and the sintering temperature was changed to 1948 K.

Example 44

An MgO target for sputtering according to the Example 44 (electrical resistivity: 7.5×10$^{-5}$ mΩ·cm) was manufactured as in the Example 1, except that the amount of the MgO powder was changed to 40.0 mol %, the TiC powder was changed to 60.0 mol % of the TiN powder having an average particle diameter of 1.0 μm and a purity of 2 N, and the sintering temperature was changed to 1948 K.

Comparative Example 11

An MgO target for sputtering according to the comparative Example 11 was to be manufactured as in the Example 1, except that the amount of the MgO powder was changed to 39.0 mol %, the amount of the TiC powder was changed to 61.0 mol %, and the sintering temperature was changed to 1948 K; however, dense sintering could not be performed. Although the sintering temperature was increased, the MgO crystal particles were grown to become an inhomogeneous sintered body. A similar result was obtained when the TiC powder amount was more than 61.0 mol %.

Comparative Example 12

An MgO target for sputtering according to the comparative Example 12 was to be manufactured as in the Example 1, except that the amount of the MgO powder was changed to 39.0 mol %, the TiC powder was changed to 61.0 mol % of the VC powder having an average particle diameter of 1.0 μm and a purity of 2 N, and the sintering temperature was changed to 1948 K; however, dense sintering could not be performed. Although the sintering temperature was increased, the MgO crystal particles were grown to become an inhomogeneous sintered body. A similar result was obtained when the TiC powder amount was more than 61.0 mol %.

Comparative Example 13

An MgO target for sputtering according to the comparative Example 13 was to be manufactured as in the Example 1, except that the amount of the MgO powder was changed to 39.0 mol %, the TiC powder was changed to 61.0 mol % of the WC powder having an average particle diameter of 1.0 μm and a purity of 2 N, and the sintering temperature was changed to 1948 K; however, dense sintering could not be performed. Although the sintering temperature was increased, the MgO crystal particles were grown to become an inhomogeneous sintered body. A similar result was obtained when the WC powder amount was more than 61.0 mol %.

Comparative Example 14

An MgO target for sputtering according to the comparative Example 14 was to be manufactured as in the Example 1, except that the amount of the MgO powder was changed to 39.0 mol %, the TiC powder was changed to 61.0 mol % of the TiN powder having an average particle diameter of 1.0 μm and a purity of 2 N, and the sintering temperature was changed to 1948 K; however, dense sintering could not be performed. Although the sintering temperature was increased, the MgO crystal particles were grown to become an inhomogeneous sintered body. A similar result was obtained when the TiN powder amount was more than 61.0 mol %.

(Film Formation Method)

First, an MgO (001) substrate was provided as a substrate, and an Fe film as an intermediate layer between the substrate and an MgO film was formed on the substrate by sputtering. In the sputtering of the Fe film, the air in a sputtering chamber was exhausted to $5 \times 10^{-4}$ Pa, and the film formation was performed in an Ar atmosphere of 0.67 Pa. The electrical power input to a Fe target was 50 W, and the film formation was performed by an RF magnetron sputtering method.

The MgO—TiC film (Examples 1 to 8), the MgO—VC film (Examples 9 to 16), MgO—WC film (Examples 17 to 24), and the MgO—TiN film (Examples 25 to 32) were formed on the MgO (001) substrate having the intermediate layer by sputtering. In the same manner as above, the MgO—TiC film (Examples 33 to 35), the MgO—VC film (Examples 36 to 38), the MgO—WC film (Examples 39 to 41), and the MgO—TiN film (Examples 42 to 44) were formed by sputtering. In the formation of each film by sputtering, the air in the sputtering chamber was exhausted to $5 \times 10^{-4}$ Pa, and the film formation was performed in an Ar atmosphere of 0.3 Pa. The electrical power input to a target was 300 W, and the film formation was performed by a DC magnetron sputtering method.

Each substrate was subjected to X-ray diffraction (XRD) measurement, and the orientation of the formed film was examined. The results are shown in Table 1.

TABLE 1

|  | Used target | Film formation substrate | Thickness of Fe film | Film formation rate | Orientation |
| --- | --- | --- | --- | --- | --- |
| Example1 | MgO90 mol %-TiC10 mol % | MgO(001) | 10 nm | 23 nm/min | Cubic(001)orientation |
| Example2 | MgO89 mol %-TiC11 mol % | MgO(001) | 10 nm | 25 nm/min | Cubic(001)orientation |
| Example3 | MgO88.0 mol %-TiC12.0 mol % | MgO(001) | 10 nm | 27 nm/min | Cubic(001)orientation |
| Example4 | MgO85.6 mol %-TiC14.4 mol % | MgO(001) | 10 nm | 33 nm/min | Cubic(001)orientation |
| Example5 | MgO77.6 mol %-TiC22.4 mol % | MgO(001) | 10 nm | 36 nm/min | Cubic(001)orientation |
| Example6 | MgO60 mol %-TiC40 mol % | MgO(001) | 10 nm | 64 nm/min | Cubic(001)orientation |
| Example7 | MgO55 mol %-TiC45 mol % | MgO(001) | 10 nm | 72 nm/min | Cubic(001)orientation |
| Example8 | MgO50.0 mol %-TiC50.0 mol % | MgO(001) | 10 nm | 80 nm/min | Cubic(001)orientation |
| Example9 | MgO90 mol %-VC10 mol % | MgO(001) | 10 nm | 13 nm/min | Cubic(001)orientation |
| Example10 | MgO89 mol %-VC11 mol % | MgO(001) | 10 nm | 14 nm/min | Cubic(001)orientation |
| Example11 | MgO88.0 mol %-VC12.0 mol % | MgO(001) | 10 nm | 15 nm/min | Cubic(001)orientation |
| Example12 | MgO85.0 mol %-VC15.0 mol % | MgO(001) | 10 nm | 19 nm/min | Cubic(001)orientation |
| Example13 | MgO69.3 mol %-VC30.7 mol % | MgO(001) | 10 nm | 39 nm/min | Cubic(001)orientation |
| Example14 | MgO60 mol %-VC40 mol % | MgO(001) | 10 nm | 51 nm/min | Cubic(001)orientation |
| Example15 | MgO55 mol %-VC45 mol % | MgO(001) | 10 nm | 57 nm/min | Cubic(001)orientation |
| Example16 | MgO50.0 mol %-VC50.0 mol % | MgO(001) | 10 nm | 64 nm/min | Cubic(001)orientation |
| Example17 | MgO90 mol %-WC10 mol % | MgO(001) | 10 nm | 21 nm/min | Cubic(001)orientation |
| Example18 | MgO89 mol %-WC11 mol % | MgO(001) | 10 nm | 23 nm/min | Cubic(001)orientation |
| Example19 | MgO88.0 mol %-WC12.0 mol % | MgO(001) | 10 nm | 25 nm/min | Cubic(001)orientation |
| Example20 | MgO85.0 mol %-WC15.0 mol % | MgO(001) | 10 nm | 31 nm/min | Cubic(001)orientation |
| Example21 | MgO72.1 mol %-WC27.9 mol % | MgO(001) | 10 nm | 57 nm/min | Cubic(001)orientation |
| Example22 | MgO60 mol %-WC40 mol % | MgO(001) | 10 nm | 81 nm/min | Cubic(001)orientation |
| Example23 | MgO55 mol %-WC45 mol % | MgO(001) | 10 nm | 92 nm/min | Cubic(001)orientation |
| Example24 | MgO50.0 mol %-WC50.0 mol % | MgO(001) | 10 nm | 102 nm/min | Cubic(001)orientation |
| Example25 | MgO90 mol %-TiN10 mol % | MgO(001) | 10 nm | 21 nm/min | Cubic(001)orientation |
| Example26 | MgO89 mol %-TiN11 mol % | MgO(001) | 10 nm | 23 nm/min | Cubic(001)orientation |
| Example27 | MgO88.0 mol %-TiN12.0 mol % | MgO(001) | 10 nm | 25 nm/min | Cubic(001)orientation |
| Example28 | MgO85.0 mol %-TiN15.0 mol % | MgO(001) | 10 nm | 31 nm/min | Cubic(001)orientation |
| Example29 | MgO75.2 mol %-TiN24.8 mol % | MgO(001) | 10 nm | 35 nm/min | Cubic(001)orientation |
| Example30 | MgO60 mol %-TiN40 mol % | MgO(001) | 10 nm | 56 nm/min | Cubic(001)orientation |
| Example31 | MgO55 mol %-TiN45 mol % | MgO(001) | 10 nm | 63 nm/min | Cubic(001)orientation |
| Example32 | MgO50.0 mol %-TiN50.0 mol % | MgO(001) | 10 nm | 70 nm/min | Cubic(001)orientation |
| Comparative Example1 | MgO100 mol %-TiC0 mol % | MgO(001) | 10 nm | — | — |
| Comparative Example2 | MgO95 mol %-TiC5 mol % | MgO(001) | 10 nm | — | — |
| Comparative Example3 | MgO92.9 mol %-TiC7.1 mol % | MgO(001) | 10 nm | — | — |
| Comparative Example4 | MgO91 mol %-TiC9 mol % | MgO(001) | 10 nm | — | — |
| Example33 | MgO49 mol %-TiC51 mol % | MgO(001) | 10 nm | 82 nm/min | Cubic(001)orientation |
| Example34 | MgO45 mol %-TiC55 mol % | MgO(001) | 10 nm | 88 nm/min | Cubic(001)orientation |
| Example35 | MgO40 mol %-TiC60 mol % | MgO(001) | 10 nm | 96 nm/min | Cubic(001)orientation |
| Comparative Example5 | MgO95 mol %-VC5 mol % | MgO(001) | 10 nm | — | — |
| Comparative Example6 | MgO91 mol %-VC9 mol % | MgO(001) | 10 nm | — | — |
| Example36 | MgO49 mol %-VC51 mol % | MgO(001) | 10 nm | 65 nm/min | Cubic(001)orientation |
| Example37 | MgO45 mol %-VC55 mol % | MgO(001) | 10 nm | 70 nm/min | Cubic(001)orientation |
| Example38 | MgO40 mol %-VC60 mol % | MgO(001) | 10 nm | 77 nm/min | Cubic(001)orientation |
| Comparative Example7 | MgO95 mol %-WC5 mol % | MgO(001) | 10 nm | — | — |
| Comparative Example8 | MgO91 mol %-WC9 mol % | MgO(001) | 10 nm | — | — |

TABLE 1-continued

| | Used target | Film formation substrate | Thickness of Fe film | Film formation rate | Orientation |
|---|---|---|---|---|---|
| Example39 | MgO49 mol %-WC51 mol % | MgO(001) | 10 nm | 104 nm/min | Cubic(001)orientation |
| Example40 | MgO45 mol %-WC55 mol % | MgO(001) | 10 nm | 112 nm/min | Cubic(001)orientation |
| Example41 | MgO40 mol %-WC60 mol % | MgO(001) | 10 nm | 122 nm/min | Cubic(001)orientation |
| Comparative Example9 | MgO95 mol %-TiN5 mol % | MgO(001) | 10 nm | — | — |
| Comparative Example10 | MgO91 mol %-TiN9 mol % | MgO(001) | 10 nm | — | — |
| Example42 | MgO49 mol %-TiN51 mol % | MgO(001) | 10 nm | 71 nm/min | Cubic(001)orientation |
| Example43 | MgO45 mol %-TiN55 mol % | MgO(001) | 10 nm | 77 nm/min | Cubic(001)orientation |
| Example44 | MgO40 mol %-TiN60 mol % | MgO(001) | 10 nm | 84 nm/min | Cubic(001)orientation |

Example

Comparative Example

As seen in Table 1, in the MgO—TiC film (Examples 1 to 8), the MgO—VC film (Examples 9 to 16), the MgO—WC film (Examples 17 to 24), and the MgO—TiN film (Examples 25 to 32), it was confirmed that a film which had a cubic structure, was singly oriented on the (001) surface, was dense and smooth, and had substantially no so-called particle was obtained.

As described above, by virtue of the use of the MgO target for sputtering mainly composed of MgO and the electroconductive compound TiC, VC, or TiN having a cubic crystal system or the electroconductive compound WC having a hexagonal crystal system, it is possible to form a film having a cubic crystal system and singly oriented on the (001) surface, and it was found that the target concerned can be most suitably used for forming a ground layer of a magnetic layer of a magnetic recording medium. Meanwhile, the MgO targets for sputtering of the Examples 33 to 44 were film-formed by sputtering in the same manner as above, so that the film formation rate was large, and a film singly oriented on the (001) surface could be formed as in the above case; however, a smooth and dense film sometimes could not be obtained owing to production of particles. Although the MgO targets for sputtering of the comparative Examples 1 to 10 were to be film-formed by sputtering as in the same manner as above, they could not be film-formed by the DC sputtering method because the resistance values of the targets were large. The materials in the comparative Examples 11 to 14 could not be provided in the evaluation of sputtering film formation because no dense sintered body could be obtained.

A powder having a smaller particle diameter than the electroconductive powder such as the TiC powder used in the Examples 1 to 44 is used, and when the particles of the electroconductive powder are adjacent to the grain boundary of the MgO particles in the MgO target, a path for electrons is formed. Even in the comparative Example 3, for example, it was found that film formation could be performed even if the concentration of the electroconductive powder was less than 7.1 mol %.

Although not listed as a Comparative Example in Table 1, the MgO target for sputtering in which particles of, for example, TaC (cubic crystal system), NbC (body-centered cubic crystal system), SiC (hexagonal crystal system), $Cr_3C_2$ (orthorhombic crystal system), $Fe_3C_2$ (orthorhombic crystal system), or C (hexagonal crystal system) were added as the electroconductive materials to the MgO particles was manufactured. However, the MgO target in which the particles of TaC (cubic crystal system), NbC (body-centered cubic crystal system), or SiC (hexagonal crystal system) were added to the MgO particles could not be satisfactorily sintered, so that sputtering film formation could not be performed. In the MgO target in which the particles of $Cr_3C_2$ (orthorhombic crystal system), $Fe_3C_2$ (orthorhombic crystal system), or C (hexagonal crystal system) were added to the MgO particles, although sputtering film formation could be performed, the particles are significantly produced, so that a dense and smooth film could not be obtained. Thus, the MgO target is not suitable as the target for DC sputtering. Particularly, in $Cr_3C_2$ (orthorhombic crystal system) and $Fe_3C_2$ (orthorhombic crystal system), the single orientation could not be imparted to the (001) surface of the MgO film. Additionally, in crystal system electroconductive materials other than the electroconductive materials having the cubic crystal system or the hexagonal crystal system according to the present invention, the single orientation could not be imparted to the (001) surface of the MgO film, similarly. After all, it was found that TiC (cubic crystal system), VC (cubic crystal system), TiN (cubic crystal system), and WC (hexagonal crystal system) were high-melting point electroconductive materials and suitable for the target as the object of the present invention.

The invention claimed is:

1. An MgO sputtering target, which comprises
a pressed and sintered body having an exposed surface on which ions impinge, and consisting essentially of MgO particles and particles of an electroconductive compound, and has an electrical resistivity of from $1\times10^{-5}$ mΩcm to $1\times10^6$ mΩ·cm, and
wherein a ratio of MgO to the total of MgO and the electroconductive compound contained in the MgO target is 40 to 90 mol %,
in which the electroconductive compound is capable of imparting orientation to a MgO film when the MgO film containing the electroconductive compound is formed by DC sputtering, and
the particles of electroconductive compound exist in a grain boundary of MgO particles,
wherein the electroconductive compound is at least one of TiC, VC, WC, and TiN.

2. The MgO target for sputtering according to claim 1, wherein a crystal system of the electroconductive compound is a cubic crystal system or a hexagonal crystal system.

3. The MgO target for sputtering according to claim 1, wherein particles of the electroconductive compound are in contact with each other in the MgO target, and form a path for electrons.

4. The MgO target for sputtering according to claim 1, wherein the electroconductive compound encompasses the MgO particles.

5. The MgO target for sputtering according to claim 1, wherein a ratio of MgO to the total of MgO and the electroconductive compound contained in the MgO target is 50 to 90 mol %.

6. The MgO target for sputtering according to claim 1, wherein a ratio of MgO to the total of MgO and the electroconductive compound contained in the MgO target is 65 to 90 mol %.

7. An MgO sputtering target, which comprises a pressed and sintered body having an exposed surface on which ions impinge, and consisting of MgO particles and particles of an electroconductive compound,
  wherein particles of the electroconductive compound comprises an electroconductive compound,
  wherein the pressed and sintered body is formed by mixing the MgO particles and the particles of the electroconductive compound,
  blending and dispersing the mixed MgO particles and the particles of the electroconductive compound and
  sintering the blended MgO particles and particles of the electroconductive compound,
  wherein the pressed and sintered body has an electrical resistivity of from $1\times10^{-5}$ mΩcm to $1\times10^{6}$ mΩ·cm,
  the electroconductive compound is capable of imparting orientation to a MgO film when the MgO film containing the electroconductive compound is formed by DC sputtering,
  the particles of electroconductive compound exist in a grain boundary of MgO particles,
  a ratio of MgO to the total of MgO and the electroconductive compound contained in the MgO target is 40 to 90 mol %, and
  the electroconductive compound is at least one of TiC, VC, WC, and TiN.

8. The MgO target for sputtering according to claim 7, wherein a crystal system of the electroconductive compound is a cubic crystal system or a hexagonal crystal system.

9. The MgO target for sputtering according to claim 7, wherein particles of the electroconductive compound are in contact with each other in the MgO target, and form a path for electrons.

10. The MgO target for sputtering according to claim 7, wherein the electroconductive compound encompasses the MgO particles.

11. The MgO target for sputtering according to claim 7, wherein a ratio of MgO to the total of MgO and the electroconductive compound contained in the MgO target is 50 to 90 mol %.

12. The MgO target for sputtering according to claim 7, wherein a ratio of MgO to the total of MgO and the electroconductive compound contained in the MgO target is 65 to 90 mol %.

* * * * *